United States Patent [19]

Jastrzebski

[11] Patent Number: 4,891,092
[45] Date of Patent: Jan. 2, 1990

[54] METHOD FOR MAKING A SILICON-ON-INSULATOR SUBSTRATE

[75] Inventor: Lubomir L. Jastrzebski, Plainsboro, N.J.

[73] Assignee: General Electric Company, Schenectady, N.Y.

[21] Appl. No.: 818,032

[22] Filed: Jan. 13, 1986

[51] Int. Cl.$^4$ ............................................. C30B 25/04
[52] U.S. Cl. ................................. 156/610; 156/612; 156/613; 156/614; 156/DIG. 64; 156/DIG. 99
[58] Field of Search ............... 156/610, 612, 613, 614, 156/DIG. 64, DIG. 99; 148/DIG. 117, DIG. 159; 427/94, 95

[56] References Cited

U.S. PATENT DOCUMENTS

| | | | |
|---|---|---|---|
| 4,272,308 | 6/1981 | Varshney | 148/DIG. 117 |
| 4,361,600 | 11/1982 | Brown | 156/613 |
| 4,371,421 | 2/1983 | Fan et al. | 156/624 |
| 4,461,670 | 7/1984 | Cellar et al. | 156/DIG. 64 |
| 4,482,422 | 11/1984 | McGinn et al. | 156/612 |
| 4,497,683 | 2/1985 | Cellar et al. | 156/DIG. 64 |
| 4,533,429 | 8/1985 | Josquin | 148/1.5 |
| 4,549,926 | 10/1985 | Corboy, Jr. et al. | 156/612 |
| 4,557,794 | 12/1985 | McGinn et al. | 156/612 |
| 4,578,142 | 3/1986 | Corbey et al. | 156/612 |

OTHER PUBLICATIONS

Kooi et al., Locos Devices, Philips Resources Reports No. 26, 1971, pp. 166 to 180.
Ghardhi, VLSI Fabrication Principles, John Wiley and Sons Inc., 1983, pp. 576-582.

Primary Examiner—John Doll
Assistant Examiner—Robert M. Kunemund
Attorney, Agent, or Firm—Henry I. Steckler; James C. Davis, Jr.; Paul R. Webb, II

[57] ABSTRACT

A mask of insulating material is formed on the major surface of a semiconductor wafer, the mask including apertures to the wafer surface. A layer of monocrystalline silicon is then formed through the apertures and over the mask. The silicon within each aperture is next replaced with an insulating plug and epitaxial silicon is grown from the remaining portions of the monocrystalline silicon layer so as to form a continuous monocrystalline silicon sheet overlying the mask and plug.

7 Claims, 3 Drawing Sheets

METHOD FOR MAKING A SILICON-ON-INSULATOR SUBSTRATE

The present invention relates to a method for fabricating an electrically isolated monocrystalline silicon layer on a major surface of a silicon wafer. More particularly, the invention relates to a two step selective epitaxial growth process for fabricating such a structure.

BACKGROUND OF THE INVENTION

Microelectronic semiconductor devices such as transistors, resistors and diodes are conventionally fabricated in monocrystalline silicon substrates and in monocrystalline silicon films on sapphire substrates. A plurality of such devices may be interconnected to form a monolithic integrated circuit structure on a "chip," i.e., a relatively small piece of a substrate wafer. Devices are fabricated on sapphire substrates, and termed silicon-on-sapphire or SOS structures, when it is desired to isolate individual devices from one another. Such isolation may be important, for example, when the ambient environment in which the chip is to operate includes ionizing radiation. Compared to structures fabricated in bulk silicon substrates, SOS structures in such environments provide no crosstalk among devices on a chip and no latchup between devices in the case of complementary metal oxide semiconductor (CMOS) structures.

However, conventional SOS structures also have certain inherent disadvantages. When the silicon film on the sapphire surface is relatively thin, i.e. less than approximately 0.3 microns (3000 Angstroms), the crystallographic quality thereof is significantly reduced. This in turn causes charge carrier mobility to be relatively low and minority carrier lifetime to be relatively short. Additionally, compared to silicon substrates, sapphire substrates are relatively expensive and are in shorter supply.

In an effort to overcome these difficulties with conventional SOS structures the present invention was conceived.

SUMMARY OF THE INVENTION

A mask of insulating material is formed on the major surface of a semiconductor wafer, the mask including apertures to the wafer surface. A layer of monocrystalline silicon is then formed through the mask apertures and over the mask. The silicon within each aperture is next replaced with an insulating plug and epitaxial silicon is grown from the remaining portions of the monocrystalline silicon layer so as to form a continuous monocrystalline silicon sheet overlying the mask and plug.

BRIEF DESCRIPTION OF THE DRAWING

FIGS. 1A-5A are sectional views of a portion of a semiconductor substrate fabricated in accordance with the method of the present invention.

FIGS. 1B-9B are sectional views of a second embodiment of the process of the present invention.

DETAILED DESCRIPTION OF THE PREFERRED EMBODIMENTS

Figure 1A:
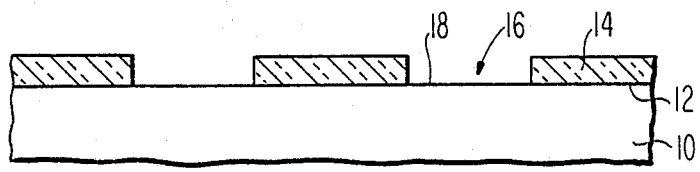

FIGS. 1A-5A represent the process sequence for the basic form of the method of the present invention. A semiconductor substrate 10 having a major surface 12 is provided and an apertured mask 14 of insulating material is formed on the surface 12. As shown in FIG. 1A, one or more apertures 16 in the mask 14 expose, correspondingly, one or more nucleation sites 18 on the surface 12 of the substrate 10. The preferred substrate material is monocrystalline silicon and the mask 14 is an insulator such as silicon oxide, having a thickness less than 500 Angstroms, which in the preferred embodiment is approximately 250 Angstroms. This thin silicon oxide mask 14 may be formed by conventional chemical vapor deposition (CVD) or thermal oxidation techniques, and the apertures 16 may be formed by conventional photolithographic processing. Each aperture will typically be rectangular in shape, have a width of approximately 0.5 to 2.5 microns and be spaced approximately 0.5 to 2.5 microns from the next aperture, although uniform spacing is not required. Further elaboration on the preferred configuration of the apertured mask may be found in U.S. Pat. No. 4,482,422, METHOD FOR GROWING A LOW DEFECT MONOCRYSTALLINE LAYER ON A MASK, J. T. McGinn et al., Nov. 13, 1984.

Figure 2A:
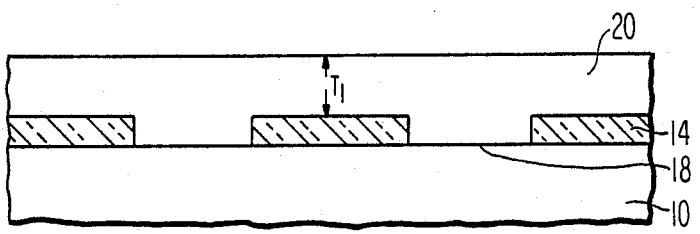

In the next step of the process, as illustrated in FIG. 2A, a monocrystalline silicon layer 20 is formed through the mask apertures 16 and over the mask 14. This monocrystalline silicon layer 20 may effectively be formed by the epitaxial lateral overgrowth (ELO) technique elaborated upon in commonly assigned U.S. Application Serial No. 608,544, METHOD FOR GROWING MONOCRYSTALLINE SILICON THROUGH A MASK LAYER, J. F. Corboy, Jr. et al., filed May 10, 1984. Basically, the ELO process comprises a two stage silicon deposition/etching cycle. In the deposition stage, silicon is deposited from a gas mixture which includes a silicon-source gas such as silane ($SiH_4$), dichlorosilane ($SiH_2Cl_2$), or silicon tetrachloride ($SiCl_4$) and optionally a carrier gas such as hydrogen and a silicon-etching gas such as HCl. In the etching stage, a portion of the silicon deposited during the deposition stage is etched in a gas mixture including a silicon-etching gas, such as HCl. Repeating the deposition/etching cycle yields monocrystalline silicon growth at each nucleation site. When the epitaxial growth in each nucleation site exceeds the thickness of the mask 14, the growth proceeds laterally, across the surface of the mask 14 as well as vertically. In the process of the invention this lateral epitaxial growth is continued until a continuous layer 20 having a thickness $T_1$ over the mask 14 is formed.

Figure 3A:
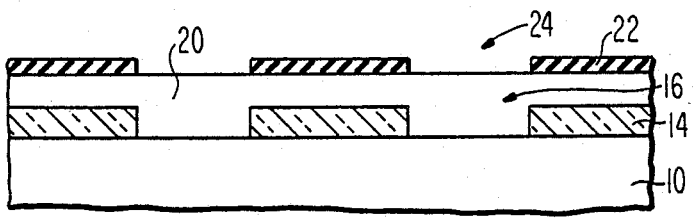

Prior to the next photolithographic sequence, illustrated in FIG. 3A, it may be necessary to reduce the thickness $T_1$ of the monocrystalline silicon layer 20. In the optimum configuration for this embodiment the thickness of the monocrystalline silicon layer 20 over the mask 14 should be approximately equal to or less than the thickness of the mask 14, e.g., when the mask 14 is 250 Angstroms, the silicon layer 20 should be approximately 200 Angstroms. Thus, if the thickness of the layer 20, as grown, is greater than 200 Angstroms, it should be uniformly thinned to approximately 200 Angstroms by a process such as that described in commonly assigned U.S. Pat. Application Serial No. 729,165, METHOD FOR THINNING SILICON, L. L. Jastrzebski et al., filed Apr. 20, 1985.

As shown in FIG. 3A, a second apertured mask 22, of a material such as silicon nitride, is next formed on the surface of the monocrystalline silicon layer 20. This second mask 22, having apertures 24 therein, serves as an oxidation barrier to portions of the monocrystalline silicon 20 that it overlies, and is hereinafter referred to as oxidation barrier 22. The apertures 24 in the oxidation barrier 22 correspond in size and location to the apertures 16 in the mask 14. The oxidation barrier 22 may be fabricated by conventional deposition and photolithographic techniques, e.g. by conventionally depositing, by CVD, a silicon nitride layer over the surface of the monocrystalline silicon layer 20 and then using standard photoresist pattern generation technology and subsequent wet or dry etching to form the apertures 24.

Figure 4A:
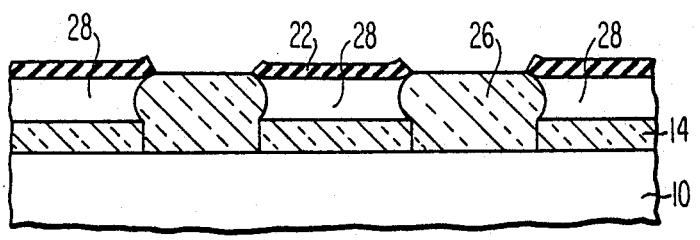

The structure of FIG. 3A is then subjected to a thermal oxidation step so as to convert the monocrystalline silicon within and between the apertures 16 and 24 into insulating plugs of silicon oxide, as identified at 26 in FIG. 4A. This thermal oxidation step might comprise, for example, heating the substrate at approximately 800° C., in steam, for approximately 2 hours. Such a temperature cycle will convert the approximate 200 Angstrom thickness of silicon above each aperture to approximately 400 Angstroms of silicon oxide.

Figure 5A:
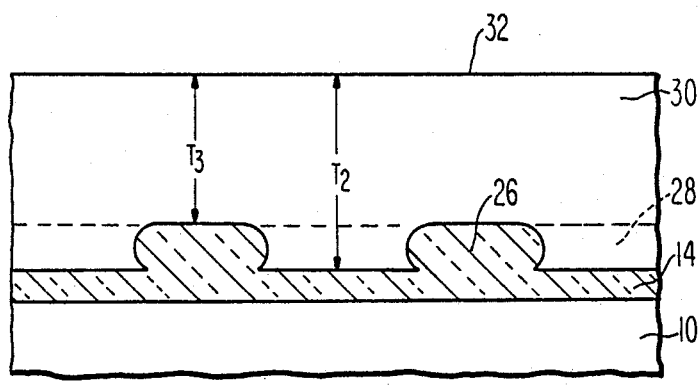

The oxidation barrier 22 is then stripped from the surface of the underlying monocrystalline silicon and these areas of monocrystalline silicon, identified at 28, are used as nucleation sites for further epitaxial growth. As shown in FIG. 5A, this further epitaxial growth, which may be performed, for example, by the previously described ELO technique, yields a monocrystalline sheet 30 of thickness $T_2$ over the mask 14 and thickness $T_3$ over each plug 26. Thus, the described process provides a monocrystalline silicon sheet 30 which is completely electrically isolated from the underlying substrate 10 by an insulating layer which comprises the mask 14 and silicon oxide plugs 26. For aperture 16 spacings in the range of 0.5 to 2.0 microns, the thickness $T_2$ of the grown monocrystalline silicon sheet 30 will typically be about 0.5 to 2.0 micron. This sheet can then be thinned to approximately 2,000 Angstroms, for example, when CMOS devices are to subsequently be fabricated therein. The surface of the monocrystalline silicon sheet, identified at 32, will be substantially flat. Therefore, the difference between $T_2$ and $T_3$, equals the height of the plugs 26 over the mask 14 and is approximately 400 Angstroms in the present example.

Figure 1B:
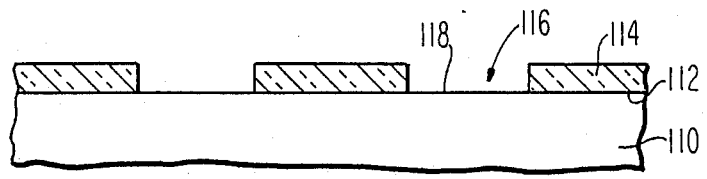

A second embodiment of the invention, which provides further advantages, is described with reference to FIGS. 1B–9B. A representative starting point for this alternative process, as shown in FIG. 1B, is similar to the starting point shown in FIG. 1A of the first embodiment. The substrate, preferably monocrystalline silicon, is identified at 110 and has a major surface 112. An apertured insulator mask 114, preferably of silicon oxide and preferably having a thickness of approximately 250 Angstroms, is provided on the surface 112 and exposes one or more nucleation sites 118 through apertures 116 therein.

Figure 2B:
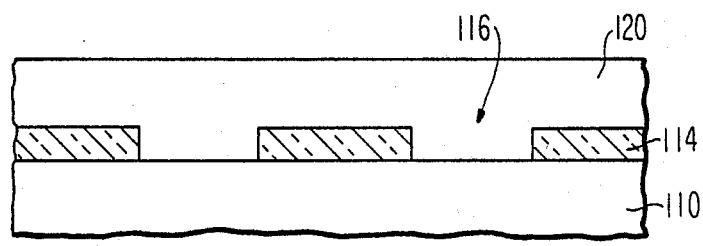
Figure 3B:
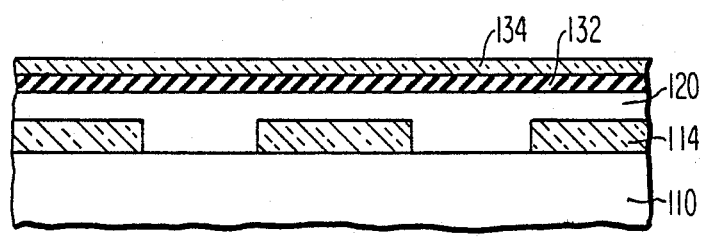

As shown in FIG. 2B, a monocrystalline silicon layer 120 is then formed through the apertures 116 and over the mask 114 again, for example, by the ELO technique. As shown in FIG. 3B, the grown monocrystalline silicon layer 120 is then thinned, if necessary, and a first oxidation barrier layer 132 of a material, such as silicon nitride, is deposited over the surface thereof. Optionally, a barrier protection layer 134 is then formed on the oxidation barrier layer 132. This optional protection layer 134 is of a material dissimilar to the oxidation barrier layer 132 and preferably comprises silicon oxide deposited by conventional CVD. The optionality of the protection layer 134 is a function of the accuracy of certain process controls, as will subsequently be elaborated upon.

Figure 4B:
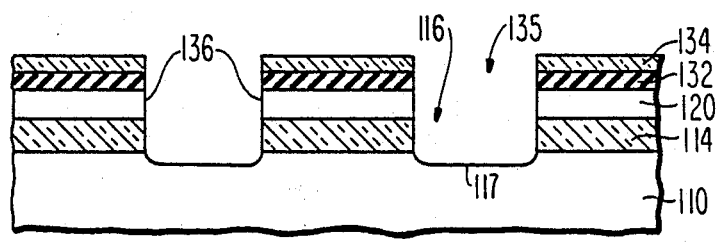

Using standard photolithographic techniques, the structure shown in FIG. of 4B is fabricated by selectively etching cavities 135, e.g. by photoresist pattern generation and conventional etching means, in the protection layer 134, oxidation barrier layer 132, and underlying monocrystalline silicon layer 120 in areas corresponding to the apertures 116 in the mask 114. As shown in FIG. 4B, a portion of the substrate surface 112 may also be etched during the etching of the monocrystalline silicon layer 120, thereby forming a recess 117 in the surface 112 at each aperture 116. Each cavity 135 in the protection layer 134, barrier layer 132, silicon layer 120 and mask 114 has a sidewall identified at 136.

Figure 5B:
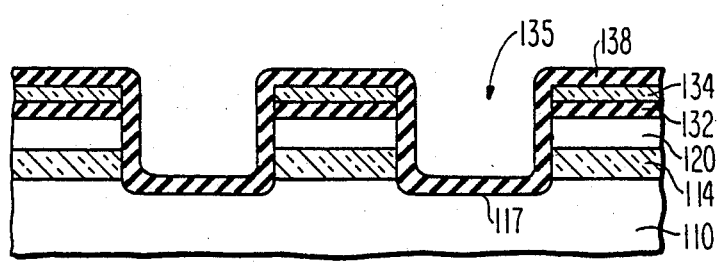

As shown in FIG. 5B, a second oxidation barrier layer 138 is then deposited over the surface of the protection layer 134 and the exposed area of the cavities 135. The second oxidation barrier 138 is a material such as silicon nitride and may conventionally be applied to a thickness of approximately 1000 Angstroms by conventional CVD techniques.

Figure 6B:
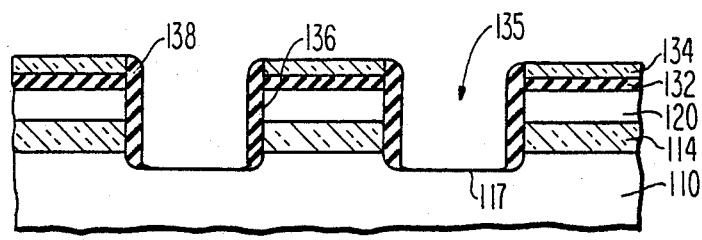

As shown in FIG. 6B, portions of the second oxidation barrier layer 138 are next selectively removed by an anisotropic etch so as to leave only those portions thereof which are on the sidewalls 136. This anisotropic etching may be performed, for example, by conventional plasma etching techniques. It should be noted that although this anisotropic etching will leave portions of the second oxidation barrier layer 138 over substantially the full height of the sidewalls 136, it is important only that the portions of the monocrystalline silicon layer 120 that terminate at the sidewalls 136 be covered.

During the etching of the second oxidation barrier layer 138, the protection layer 134 serves to shield the underlying oxidation barrier layer 132. However, it should be understood that if this anisotropic etching step can be sufficiently closely controlled so as to permit cessation of the etching prior to etching through the first barrier layer 132 and exposing the monocrystalline silicon 120, then the protection layer 134 need not be used. Thus, as previously indicated, the use of the protection layer 134 is optional, depending upon the accuracy of process control.

Figure 7B:
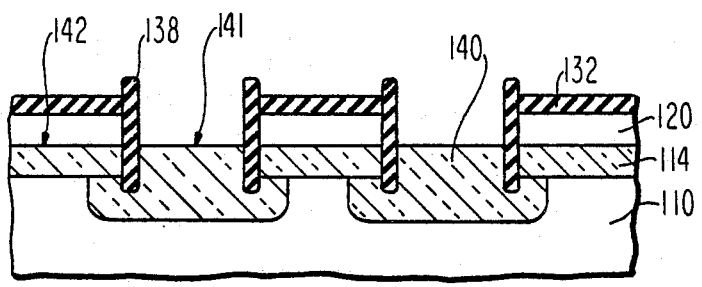
Figure 8B:
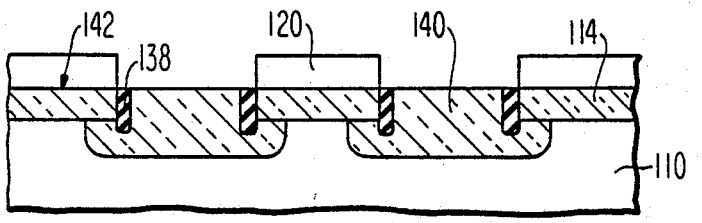

As shown in FIG. 7B, the protection layer 134 is next removed and the surface of the substrate 110 exposed within the apertures 116 is thermally oxidized so as to yield a plug 140 within each aperture 116. By appropriately controlling the thermal oxidation parameters, the surface of each plug 140, as identified at 141, can be grown so as to be coplanar with the mask 114/silicon layer 120 interface, identified at 142. In the next step, illustrated in FIG. 8B, all exposed portions of the first oxidation barrier layer 132 and second oxidation barrier layer 138 are removed by conventional etching so as to leave only those portions of the second oxidation barrier layer 138 that are disposed between each plug 140 and the surrounding mask 114. These remaining portions of the second oxidation barrier layer 138 are also coplanar with the surface 142.

Figure 9B:
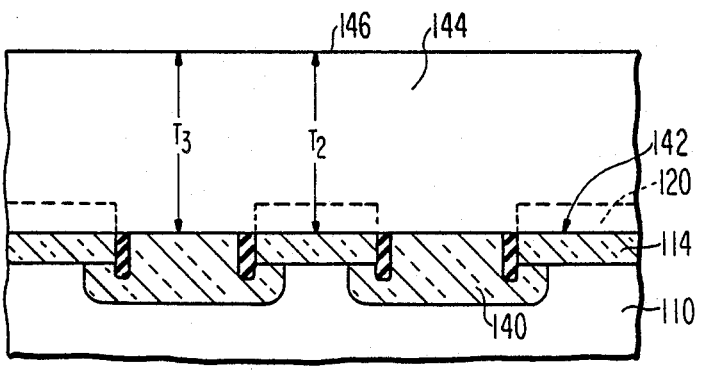

The portions of monocrystalline silicon layer 120 that are disposed over the mask 114 are now used as nucleation sites for epitaxial growth of a monocrystalline silicon sheet 144, as shown in FIG. 9B. As described with regard to the structure of FIG. 5A, the monocrystalline silicon layer 144 may also be grown by the ELO technique and optionally thinned to an approximate 2000 Angstroms thickness $T_2$ from the mask 114. The resulting surface of the monocrystalline silicon sheet 144, identified at 146, is also substantially flat. However, the silicon sheet 144 of FIG. 9B is significantly different from the silicon sheet 30 of FIG. 5A in that the underlying interface with the insulating mask 114, plugs 140 and second oxidation barrier portions 138, as represented by surface 142, is substantially planar. The thickness $T_3$ of the sheet 144 over the plugs 140 is equal to the thickness $T_2$ over the mask 114.

Thus, both embodiments of the present invention present methods for fabricating silicon-on-insulator (SOI) structures which may be used as substrates for subsequent semiconductor device fabrication. Semiconductor device structures may be formed by conventional processing in either the monocrystalline silicon sheet 30 of FIG. 5A or the monocrystalline silicon sheet 144 of FIG. 9B. When CMOS devices are to be fabricated in the SOI structure of the invention, it may be desirable to use the process of FIGS. 1B-9B because of the flatter insulator surface 142 and more uniformly thick silicon sheet that results.

A CMOS device fabrication sequence would typically involve the implantation and/or diffusion of dopant atoms from the surface 32 or 146 through the thickness of the sheet 30 or 144 respectively. Since dopant concentration at the silicon/insulator interface is a function of depth from the silicon surface, the concentration would significantly vary depending upon whether the diffusion or implantation occurred through thickness $T_2$ or thickness $T_3$ in the embodiment of FIG. 5A. This could in turn affect the parameter known as "back channel leakage" in the devices produced. Thus, although both embodiments provide novel and effective methods for fabricating SOI substrates, the embodiment of FIGS. 1B-9B may be preferable in certain CMOS applications despite the additional cost associated with the additional processing.

What is claimed is:

1. A method for forming an electrically isolated layer of monocrystalline silicon on a semiconductor substrate, comprising:
   (a) providing a semiconductor substrate having a major surface;
   (b) forming a mask of insulating material on the major surface, the mask including an aperture therethrough to the surface;
   (c) forming a layer of monocrystalline silicon through the aperture and over the mask;
   (d) forming a first oxidation-barrier layer on the monocrystalline silicon layer and a barrier-protection layer, of a different material, on the first oxidation-barrier layer, the first oxidation-barrier layer and barrier-protection layer including an aperture therethrough in a location corresponding to the aperture in the underlying insulator mask;
   (e) removing the monocrystalline silicon layer within the aperture in the insulator mask and between that aperture and the aperture in the first oxidation-barrier layer so as to form a cavity that exposes the substrate;
   (f) forming a second oxidation-barrier layer on the surface of the monocrystalline silicon layer exposed within the cavity;
   (g) thermally oxidizing the exposed portion of the substrate so as to yield an insulating plug having a surface which is coplanar with the insulator mask;
   (h) removing the portions of the first and second oxidation-barrier layers that are in contact with the monocrystalline silicon layer; and
   (i) epitaxially growing silicon from the remaining portions of the monocrystalline silicon layer so as to form a continuous monocrystalline silicon sheet overlying the insulator mask and plug.

2. A method in accordance with claim 1 wherein the semiconductor wafer is monocrystalline silicon.

3. A method in accordance with claim 1 wherein the apertured mask comprises silicon oxide.

4. A method in accordance with claim 1 wherein the mask and the monocrystalline silicon layer formed thereover are each less than approximately 250 Angstroms thick.

5. A method in accordance with claim 1, wherein step (f) comprises:
   chemically vapor depositing silicon nitride; and
   anisotropically etching so as to selectively remove silicon nitride from the portions of the substrate exposed within the cavity and from the surface of the barrier-protection layer.

6. A method in accordance with claim 1 wherein the first oxidation barrier layer is silicon nitride.

7. A method in accordance with claim 1 comprising:
   forming the barrier protection layer by chemically vapor depositing silicon oxide.

* * * * *